United States Patent
Gates et al.

[11] Patent Number: 5,959,914
[45] Date of Patent: Sep. 28, 1999

[54] MEMORY CONTROLLER WITH ERROR CORRECTION MEMORY TEST APPLICATION

[75] Inventors: Dennis E. Gates; Scott E. Greenfield; Thomas L. Langford, II, all of Wichita, Kans.

[73] Assignee: LSI Logic Corporation, Milpitas, Calif.

[21] Appl. No.: 09/049,316

[22] Filed: Mar. 27, 1998

[51] Int. Cl.$^6$ .................................................. G11C 7/00
[52] U.S. Cl. .......................................... 365/201; 371/21.1
[58] Field of Search ............................. 365/201, 189.07, 365/189.01; 371/21.1, 21.2

[56] References Cited

U.S. PATENT DOCUMENTS

| | | | |
|---|---|---|---|
| 4,604,750 | 8/1986 | Manton et al. | 371/38 |
| 5,006,787 | 4/1991 | Katircioglu et al. | 324/73.1 |
| 5,195,099 | 3/1993 | Ueda et al. | 371/40.4 |
| 5,261,068 | 11/1993 | Gaskins et al. | 395/425 |
| 5,475,693 | 12/1995 | Christopherson et al. | 371/10.2 |
| 5,541,886 | 7/1996 | Hasbun | 365/230.01 |
| 5,546,402 | 8/1996 | Niijima et al. | 371/10.2 |
| 5,854,795 | 12/1998 | Osano | 365/201 X |
| 5,872,802 | 2/1999 | Knaack et al. | 365/201 X |

Primary Examiner—Do Hyun Yoo

[57] ABSTRACT

Apparatus and method for testing of memory locations containing both test data and test check bits are provided. The apparatus includes a memory controller that communicates with memory devices. In a test mode of operation using a test mode control bit, the memory controller receives test data, together with test check bits that have values corresponding to at least some of the values of the test data. The test data and test check bits are written to desired memory locations of the memory devices. The memory controller is involved in a subsequent read of these same memory locations and receives the test data and test check bits from those previously written memory locations. The memory controller determines whether a correspondence exists between the test check bits that were written and the test check bits that were read. Any lack of correspondence is indicative of one or more memory location faults. Both the test data and the test check bits are checked for accuracy during single transfer operations and the checking of the test check bits is conducted using at least some of the values of the associated test data.

18 Claims, 3 Drawing Sheets

Mapping of data and check bit positions (D 0-63, C 0-7) to external memory bit positions (DQ 0-71) in normal mode:

DQ bits:
0000 0000 0011 1111 1111 2222 2222 2233 3333 3333 4444 4444 4455 5555 5555 6666 6666 6677
0123 4567 8901 2345 6789 0123 4567 8901 2345 6789 0123 4567 8901 2345 6789 0123 4567 8901

Data, Check bits:
dddd dddd dddd dddd dddd dddd ddcc dddd ddcc dddd dddd dddd dddd dddd dddd dddd ddcc
0000 0000 0011 1111 1111 2222 2200 2222 3300 3333 3333 4444 4444 4455 5555 5500 5566 6?77
0123 4567 8901 2345 6789 0123 4525 6789 0134 2345 6789 0123 4567 8901 2345 6761 8901 ?370

FIG. 3

Mapping of data bits (D 0-63) to external memory bit positions (DQ 0-71) in test mode:

DQ bits:
0000 0000 0011 1111 1111 2222 2222 2233 3333 3333 4444 4444 4455 5555 5555 6666 6666 6677
0123 4567 8901 2345 6789 0123 4567 8901 2345 6789 0123 4567 8901 2345 6789 0123 4567 8901

Data bits:
dddd dddd dddd dddd dddd dddd ddcc dddd dddd dddd dddd dddd dddd dddd dddd dddd ddcc
0000 0000 0011 1111 1111 2222 0000 0000 2222 2233 3333 3333 4444 4444 4455 5555 5555 6666
0123 4567 8901 2345 6789 0123 0123 4567 4567 8901 2345 6789 0123 4567 8901 2345 6789 0123

FIG. 4

| Data[63-0] to be written to memory | Computed ECC Chkbits[7-0] (normal mode) | DQ[71-0 (normal mode) | DQ[71-0 (test mode) |
|---|---|---|---|
| aa55aa55aa55aa55 | 00 | 2a255aa552a255aa55 | aa55aa55aa5555aa55 |
| a5a5a5a5a5a5a5a5 | 99 | e91a5a5a5e91a5a5a5 | a5a5a5a5a5a5a5a5a5 |
| fedcba9876543210 | f0 | 7f6dcba989da543210 | fedcba987610543210 |
| 1111111111111111 | 66 | 04d11111104d111111 | 111111111111111111 |
| 2222222222222222 | ff | c8e222222c8e222222 | 222222222222222222 |
| 4444444444444444 | 66 | 11c44444411c444444 | 444444444444444444 |
| 8888888888888888 | ff | e2c888888e2c888888 | 888888888888888888 |
| fffffffffffffffe | c1 | ff7fffffff3f3fffffe | ffffffffffffefffffe |
| 0000000000000001 | c1 | c04000000000000001 | 000000000001000001 |
| fffffffffffffffc | 03 | bfbfffffff3f3fffffc | ffffffffffcfffffc |
| 0000000000000003 | 03 | 808000000000000003 | 000000000003000003 |

Note: all values shown in hexadecimal.

FIG. 5

MEMORY CONTROLLER WITH ERROR CORRECTION MEMORY TEST APPLICATION

FIELD OF THE INVENTION

The present invention relates to testing of memory locations and, in particular, to testing memory locations containing test data and test check bits.

BACKGROUND OF THE INVENTION

Semiconductor memory, which can be either stand-alone or embedded, commonly has a substantial number of memory locations for storing bits of data. Because integrity of stored data is of major concern, it is usual practice to utilize procedures and hardware that are useful in correcting inaccurate data. More specifically, the potential exists for data to be corrupted during the time that it is stored in memory devices such as by electrical noise or by alpha particles found in memory packaging materials. Electrical noise can also cause data to be corrupted as it is being transferred across conducting lines from one location to another. Because of this possibility, it is necessary to check and correct for such data corruption. In that regard, it is known to use error correction and detection code (ECC) bits. ECC bits are a function of the state or magnitude of the data bits with which they are associated or derived from. ECC bits can be used to detect more than one bit (multiple bit) memory errors. However, common schemes for detecting multiple bit memory errors require the check bits to be stored in memory devices along with data bits, rather than storing all ECC or check bits in a separate device. This constraint related to where ECC bits can be stored relative to normal data bits must be taken into account when testing memory locations in which some of the memory locations store or contain normal data and the other of the memory locations store or contain ECC bits. Additional steps would be required to independently check such memory locations that include a combination of memory locations having normal data and also having ECC bits. That is, a first full test pattern sequence would be used to test a position or subset of the memory locations at a particular address and then a second full test pattern sequence would be used to test the remaining memory locations that were not tested during the first test pattern sequence.

In one known method for testing such memory locations, instead of check bits being generated algorithmically from test data, the states or values of test data themselves are utilized in the testing procedure. Specifically, test data that usually is stored in memory locations for containing normal data is received by and stored in memory locations that are used to store check bits. Such test data written into memory locations intended for check bits is then read. After reading such test check bits from these memory locations intended to store ECC bits, the read data is checked to determine whether or not the check bit memory locations accurately stored and transmitted the expected check bits. If not, an indication is provided that these memory locations for storing ECC or check bits may have one or more faulty memory locations.

Although this known procedure is able to test memory locations for storing check bits using test data, such a procedure lacks certain desirable features related to testing all memory locations, which contain both the test data and the associated check bits, using a single test pattern sequence during a single write operation and a subsequent single read operation. In other words, it would be desirable to test not only the memory locations containing the check bits but also those memory locations containing the test data to which the test check bits are associated, while writing, and some time later reading, data bit locations having a combination of test data and test check bits and without using another or second test pattern sequence to separately test the check bit locations.

SUMMARY OF THE INVENTION

In accordance with the present invention, testing of memory locations and memory devices is disclosed in which a set of memory locations, which can be of any arrangement or configuration and that stores test data and test check bits, are tested using a single test pattern sequence to the memory devices. A single write operation, followed at some time later by a single read operation, can effectively test all of both test data bit locations and test check bit locations at the particular address(es). It is not required that the read of the word at the particular address(es) be tested immediately following a write to that location. The written test data and test check bits are subsequently read and checked to determine whether the read information (read test data and read test check bits) matches the written information. If not, then obtainable results of the test represent an error or lack of correspondence, which is indicative of one or more memory location faults.

The apparatus of the present invention includes a memory controller defined as having a first or system side or interface and a second or memory side or interface. With respect to the system side, the memory controller functions to (1) provide an interface with a peripheral component interconnect (PCI) bus, although the control bus need not be a PCI bus but can be an internal bus via an embedded core processor or an external control bus such as the PCI bus; (2) provide RAID parity assist for queuing of exclusive or 5-operations; and (3) provide arbitration and control of a shared memory bus (SMB), although the present invention is not limited to such bus connections or operations. On the memory side or interface that provides communication between the memory controller and the memory using a memory bus, the memory controller controls information transfers to/from the memory, in conjunction with its communication with the currently selected one of the PCI bus and the shared memory bus. Regarding the transferred information to/from the memory using the memory controller, such information typically includes normal data and data or codes for detecting and correcting inaccuracies in the normal data. At different or alternative times, the transferred information includes test data and test check bits.

With regard to testing information that is transferred, the memory controller is involved in testing memory locations of the memory devices. In that regard, a separate device, which may include an IC (integrated circuit chip), is involved with inputting test data to the memory controller. Certain hardware or logic in the memory controller produces additional bits (additional test check and/or test data bits). The input, together with the subsequently produced, test data and test check bits are written to determined memory locations of the memory devices using the memory controller.

Regarding further elements and steps of the memory controller involved in testing such memory locations, input ports of the memory controller receive the previously stored test data and test check bits associated therewith. In one embodiment, the memory controller includes hardware and logic for determining whether or not the test check bits that were read correspond to the test check bits that were written at some prior time. Preferably, this is accomplished by comparing predetermined bits of the test data with the test check bits that were read. More specifically, in producing the values, states or pattern of test check bits, such is based on values of at least some of the test data that accompanies the test check bits during the writing thereof to memory devices. Consequently, if a match or accurate comparison occurs between the test check bits and such data, it can be concluded that no memory location faults are present.

The test data that is simultaneously or substantially simultaneously read using the memory controller is also checked. Preferably, this is accomplished by the memory controller transferring such test data to a desired module or device where a group comprising a number of bits, such as a byte or nibble, is compared with preceding or succeeding bytes or nibbles of the particular test data. The comparison is typically conducted using data stored or computed externally to the memory controller.

The testing of one set of the memory locations containing the test data and the test check bits is conducted using one test pattern sequence for memory locations containing both test data and test check bits. In a preferred embodiment, the number of memory locations that are tested is a function of the capacity of the bus(es) (PCI, memory bus and SMB) connected to the memory controller ports. In one embodiment, the test data includes 64 bits and the test check bits include 8 bits. Consequently, to test 72 bits of both test data and test check bits before another pass of testing, involving other memory locations having stored bits, the memory bus itself must be capable of handling the 72 bits, although the PCI and SMB interfaces need not be 72 bits. For example, the PCI interface may handle 32 data bits and one parity bit, with the PCI module responsible for conversion between the two busses.

In connection with the memory controller differentiating between a normal mode of operation (normal data transfer) and a test mode of operation (test data transfer), a test mode control signal or bit ($test_{13}$ chkbits) is utilized. That is, during test mode, the test control signal informs the memory controller that test data is being sent to it and the memory controller then functions in accordance with its test mode of operation.

Based on the foregoing summary, a number of key aspects of the present invention are readily discerned. Testing of memory locations storing both test data and test check bits is provided. The test check bits that are produced correspond to the values of at least some of the test data that the test check bits are associated with. Using a memory controller that interfaces with memory locations to be tested, any number of memory devices having memory locations can be selectively tested. In addition to the test mode of operation, the memory controller is also involved with controlling the transfer of normal data including error correction codes between memory devices and one or more control devices. Preferably, the memory controller is configured to check for the accuracy of test check bits using corresponding values of test data while another device or module checks the accuracy of the test data that is associated with such test check bits. As part of the testing of both test data and test check bits, such testing is conducted by writing, during a single write operation, a single test pattern sequence to memory locations being tested and then by reading of those same memory locations.

Additional advantages of the present invention will become readily apparent from the following discussion, particularly when taken together with the accompanying drawings.

BRIEF DESCRIPTION OF THE DRAWINGS

FIG. 3 is a table related to the transferring of normal data with ECC bits by the memory controller to desired storage locations;

FIG. 4 is a table related to the transferring of test data and test check bits to desired storage locations using the memory controller; and FIG. 5 is a table presenting examples of mapping of information to be written using either the PCI bus or the SMB to the memory in normal and test modes.

DETAILED DESCRIPTION

Figure 1:
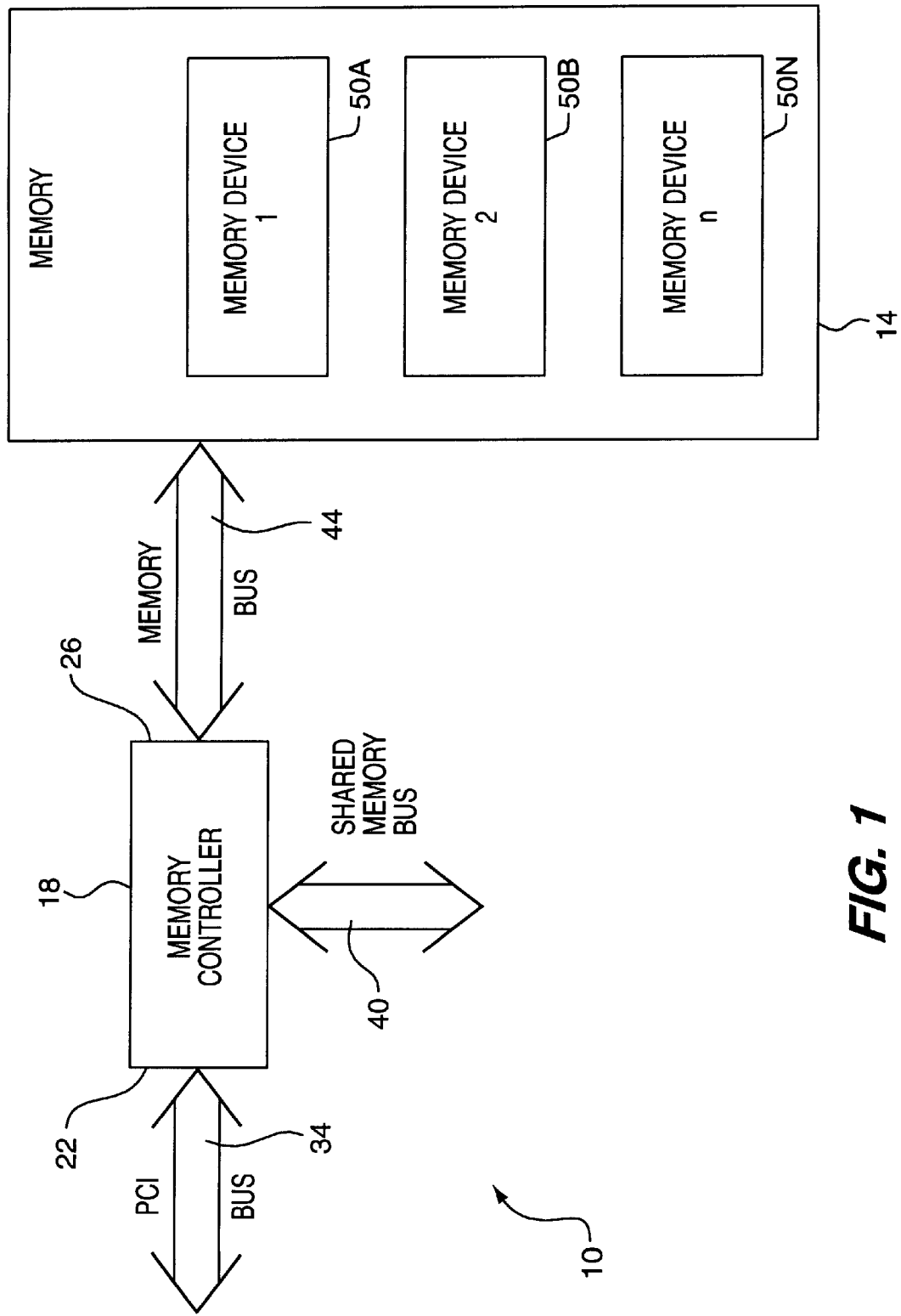
FIG. 1 is a block diagram of the present invention including the memory controller.

With reference to FIG. 1, an apparatus 10 is disclosed in which information is transferred relative to external memory 14 using a memory controller 18. The memory 14 is not limited to a particular configuration. The memory 14 can be stand-alone memory or embedded memory within the apparatus 10. When stand-alone memory, the memory may be in any configuration from where each bit is in a single stand alone device to where all the bits are in a single stand-alone device. For purposes of the following discussion, memory 14 will be referred to as external memory 14; however, all memory configurations are contemplated for use with the present invention. The transferred information commonly includes data and accompanying bits associated with the data. The memory controller 18 is used in two modes of operation, a normal mode and a test mode. During a normal mode of operation, normal or regular data is handled by the memory controller 18 for transfer relative to the external memory 14. During a test mode of operation, test data is generated for use in testing memory locations in the external memory 14. During a test mode, known values, states or patterns of data are generated, written to external memory 14 and then read back from the external memory 14. A determination is made as to whether or not the information read from the external memory 14 corresponds to the information that was written. A lack of correspondence is indicative of one or more memory location faults in the external memory 14. In the test mode of operation, the test information includes the test data and the associated bits are test check bits.

Test data and test check bits are intended to emulate or represent normal data and ECC bits. During normal operation, normal data and ECC bits are stored in the memory locations of the external memory 14. Values or states of the ECC bits are a function of the states of the normal data with which they are associated or derived. Although they need not be, the normal data and the ECC bits can be stored essentially simultaneously in the same memory devices. To emulate or represent ECC bits during test mode, test check bits are provided and are mapped to memory locations that might receive or are intended to store the ECC bits. Consequently, testing of memory locations that contain or store important ECC bits useful in detecting and correcting inaccurate data is accomplished.

With regard to the transfer of information using the memory controller 18, it includes a system side or interface 22 and a memory side or interface 26. Generally, the memory controller 18 has a number of functions. On the system side 22, the memory controller 18 serves as a buffered memory interface. As a memory interface, the memory controller 18 is a target for memory reads and writes using a peripheral component interconnect (PCI) bus 34, supporting up to two Gbytes of memory. The memory controller interface 22, in communication with the PCI bus 34, also supports access to internal registers through memory, I/O, or configuration read and write cycles. The system interface 22 of the memory controller 18 also communicates with a parity assist engine for RAID applications. The parity assist portion of the memory controller 18 operates independently of the PCI bus 34. The memory controller 18 fetches operands (data or RAID parity) from the external memory 14, calculates parity and writes the result back to the external memory 14. A shared memory bus (SMB) 40 also communicates with the system interface 22 of the memory controller 18. The SMB 40 allows for high-speed transfer between the external memory 14 and an external SMB device. In one embodiment, this external SMB device has a number of primary functions including: providing a peripheral component interconnect to PCI bridge function between the PCI bus 34 and a secondary PCI bus; and supporting 64-bit addressing and 64-bit data transfer on this secondary PCI bus. On the memory side 26, the memory controller 18 transfers information to/from the external memory 14 using a memory bus 44 in functioning with the presently selected one of the PCI bus 34, the SMB 40 and the module involved with RAID applications.

In the context of main aspects of the present invention, the PCI bus 34 and the SMB 40 can be utilized in testing of external memory bit locations, while the module involved with RAID applications would not be used in test mode. Regardless of the source of test information, the memory controller 18 is responsible for utilizing such test information to conduct write and read operations directed to the external memory 14 in order to test a group or set of memory locations.

On the memory side 26 of the memory controller 18, the memory bus 44 is utilized in connection with the transfer of a selected one of normal or test information between the memory controller 18 and the external memory 14. In one embodiment, the normal information includes data bits and ECC and the test information includes test data and test check bits. As represented in FIG. 1, the external memory 14 comprises a number of memory devices 50a, 50b . . . 50n. Each of these memory devices 50 may constitute a single semiconductor memory having a number of memory locations for storing information including normal data and ECC bits associated therewith. The memory controller 18 is able to map, in a desired manner, which data and ECC bits are stored to particular memory locations of the external memory 14. Likewise, during the test mode of operation, the memory controller 18 is involved in mapping test data and test check bits to desired memory locations of each of the memory devices 50 in order to test such memory locations.

Figure 2:
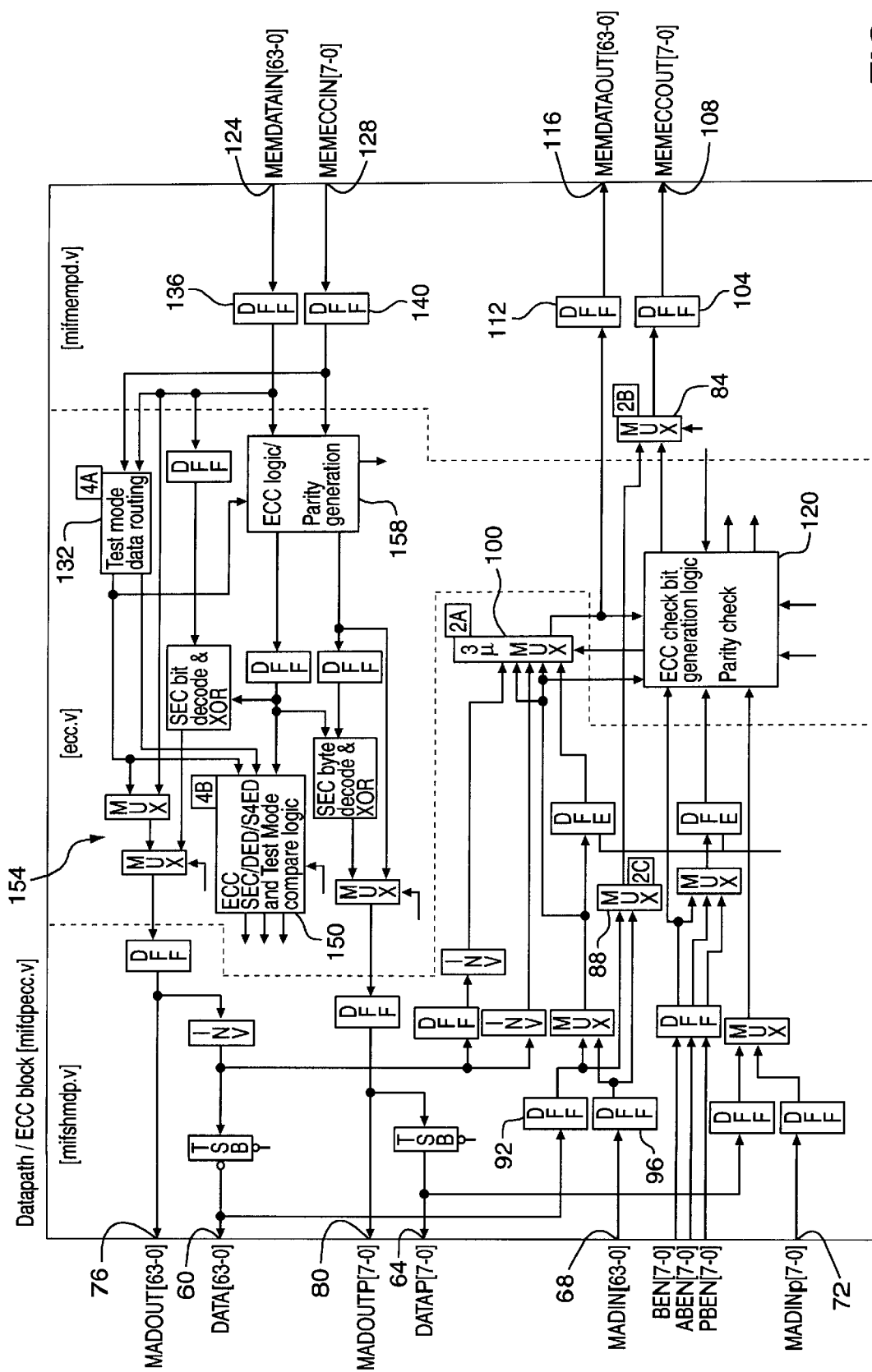
FIG. 2 is a more detailed block diagram of the memory controller illustrating data paths for data transfers to/from the memory.

With reference to FIG. 2, the memory controller 18 is illustrated and next described in more detail. The system side 22 of the memory controller 18 includes a number of ports. These ports include bi-directional data (DATA) and data parity (DATAP) ports 60, 64, respectively. These two ports 60, 64 communicate indirectly with the PCI bus 34 in transmitting information in both directions relative to the memory controller 18. The memory controller 18 also includes, in this embodiment, a number of uni-directional ports that are connected to bi-directional pads at the system interface 22. In particular, a shared memory input (MADIN) port 68 inputs data to the memory controller 18. A shared memory data parity (MADINP) port 72 receives parity data. Conversely, shared data output (MADOUT) and shared memory data parity output (MADOUTP) ports 76, 80 output data and its associated parity (during the normal mode of operation) from the memory controller 18.

The memory controller 18 includes a number of multiplexers, D flip-flops, inverters, as well as hardware useful in parity checking or parity generation useful during the normal mode of operation. In connection with establishing the test mode of operation, the memory controller 18 receives a test mode control bit using the PCI bus 34. The PCI bus 34 communicates with a PCI slave module having control registers that store, among other items, the test mode control bit. Specifically, the memory controller 18 includes a write ECC/test check bit multiplexer 84, which receives the test mode control bit as an input. When the test mode control bit is present, typically one or more test check bits, instead of ECC bits associated with normal data, are outputted by the multiplexer 84 and the remaining bits output therefrom are test data. The memory controller 18 further includes a write test check bit multiplexer 88. This multiplexer 88 receives two inputs from data source flip-flops 92, 96. The data source flip-flop 92 communicates with data input port 60 and data source flip-flop 96 communicates with shared memory data input port 68. Accordingly, the write test check bit multiplexer 88, during the test mode of operation, receives data for use in testing from one of these two ports 60, 68. The multiplexer 88 outputs typically one or more test check bits and the remaining bits are test data. In a preferred embodiment, the values of the one or more test check bits that are output correspond to or are the same as some of the values of the test data. In one embodiment, the output of the multiplexer 88 includes 8 bits, with the bits that are test check bits corresponding to the states or values of associated test data. That is, the associated test data from the selected source, either port 60 or port 68, is used to produce the bits output by the multiplexer 88. This same data for testing (includes usually both test data and test check bits) is received by a tri-state driver assembly 100. The driver assembly 100 includes tri-state drivers multiplexing data from five sources. Three of these sources are for read-modify-write cycles in normal data transfer operation that includes use of ECC bits, one of the five sources is for normal write data, and the other source is the test data. During the test mode of operation, the selected data for testing that become the test check bits output by the multiplexer 88, together with test data, are applied to the write test check bit multiplexer 84 and are output therefrom by virtue of the control applied using the test mode control bit. A write ECC/check bit output flip-flop 104 typically receives one or more test check bits, together with some test data, for outputting to the external memory 14 using an output ECC/test check bit (MEMECCOUT) port 108. Similarly, other of the test data and remaining test check bits are outputted therefrom and received by a write data output flip-flop 112. The output of this flip-flop 112 is transferred from the memory controller 18 using a memory data output (MEMDATOUT) port 116 for transfer to the external memory 14 using the memory bus 44. In one embodiment, the memory bus 44 has a 64-bit capacity in which 64 bits of data are simultaneously transferred to the external memory 14.

The memory controller 18 also includes an ECC check bit generation logic and parity check circuit or unit 120 that is utilized in the normal mode of operation. The output from this logic circuit 120 is also applied to the write ECC/test check bit multiplexer 84. In the absence of a test mode control bit, ECC bits are output by this multiplexer 84 to the write ECC/test check bit output flip-flop 104.

The memory controller 18 also includes two memory input ports. A memory data input (MEMDATIN) port 124 communicates with the memory bus 44. A memory ECC input (MEMECCIN) port 128 also communicates with the memory bus 44. During the test mode of operation, the memory ECC input port 128 typically receives at least some test check bits that were stored in the selected or desired memory locations of a particular memory device 50, while the memory data input port 124 receives the remaining test check bits.

The memory controller 18 additionally includes a test mode data routing circuit or logic 132 which, in the test mode of operation, receives test data and test check bits from input flip-flops 136, 140. The test mode data routing circuit 132 is involved in reordering data received from the external memory 14, i.e., separating the test data and the test check or redundant bits. In that regard, the test mode data routing circuitry 132 prepares the input information for checking or comparison in connection with determining whether the test check bits that are received are accurate. As previously pointed out, it is necessary to verify that the information that was previously stored is received having the value or state, which is expected or intended.

With regard to the checking or testing of the test check bits during the test mode, test mode compare logic or circuitry 150 is included in the memory controller 18. This compare logic or circuit 150 is involved in making the determination as to whether or not the obtained test check bits correspond to those values that were expected by making a comparison between the test check bits and certain of the test data bits. In one embodiment, the test check bits should correspond to certain of the test data. Such corresponding test data is input, together with the test check bits, into the test mode compare logic 150. Preferably, a single compare operation involving all of the test check bits is conducted. Based on this comparison, a determination can be made as to whether or not one or more of the test check bits is erroneous or inaccurate. That is, a determination is made as to whether or not the received test check bits correspond to what was previously provided to the memory locations for containing or storing the test check bits. When no compare or match is present, the test mode compare logic 150 outputs a signal indicating this failure and the address or addresses at which the test check bits were stored associated with this failure.

In this embodiment, the test data that was received with the test check bits is output by the memory controller 18 using one of the selected system output ports 60, 76. The test data output by such a selected port is sent to logic external to the memory controller 18 that is responsible for checking the accuracy of the test data by comparing portions, such as bytes, of the received data to determine whether or not it has been accurately received from the external memory 14. If not, a determination is made that the one or more memory locations associated with such erroneous data is faulty or subject to failure. With respect to the test data that is output by the selected one of the two ports 60, 76, each communicates with a dual multiplexer assembly 154 comprised of two multiplexers, with these two multiplexers involved in controlling the outputting of test data or normal data, depending upon the mode of operation.

The memory controller 18 also includes an ECC logic/parity generation circuit 158 that is utilized during normal data transfers for generating data parity and checking for proper ECC bits. During normal data transfer operation as well, one of the selected data parity ports 64, 80 is also utilized in the transfer of parity data from the memory controller 18.

An explanation of the test mode is continued with reference to FIGS. 3 and 4, as well as FIG. 2. As part of this, a general discussion is initially provided related to the mapping of normal data and associated ECC bits by the memory controller 18 to the external memory 14. The mapping function maps the bits in the data bus representation to bit positions found in a set of memory locations in the external memory 14. FIG. 3 illustrates 72 bits that are arranged in nibbles (4 bits). The normal data includes 64 bits and the ECC bits constitute the remaining 8 bits. The labeled DQ bits refer to bit positions in the memory bus 44. The letter "D" that is used on FIG. 3, together with the accompanying bit location, indicates that normal data is found at that particular bit location, while the letter "C" indicates that an ECC or check bit is found at that bit location. It should be appreciated that the locations of the "C" bits can be varied. What is important to note is that the mapped locations are known and they include locations for storing both data and ECC bits. In the example of FIG. 3, ECC bits are found in bit locations between data bit locations 25 and 26, 31 and 32, 57 and 58, and after data bit location 63. As can be further appreciated from this example, in order to test memory locations that store such normal data and ECC bits, for efficiency purposes, it is advantageous to simultaneously or substantially simultaneously test memory locations containing both data and code or check bits since they are intermingled as part of the 72 stored bits.

With reference to FIG. 4, an illustrative example related to such simultaneous or substantially simultaneously testing is provided. Like FIG. 3, 72 bits are arranged by nibbles (4 bits). In accordance with the present invention, the test check bits that are to be stored in connection with testing memory locations for containing ECC bits, for example, are produced from the test data. In order to reflect this correspondence between certain of the test data and the test check bits, FIG. 4 illustrates that the bits located between test data bit locations 23 and 24 are identified as bit locations 00 through 07. This is intended to reflect the example in which the test check bits have values or states that correspond to the test data found in bit locations 00–07. Consequently, when checking the accuracy of the written and subsequently read locations containing the test check bits, a comparison is made between the test check bits of these memory locations and the test data associated with the bit locations 00–07. As should be additionally appreciated, the location or identification of the test check bits can vary, and these eight bits could be located at any eight of the 72 bit locations.

Referring to FIG. 5, further examples related to the mapping of data to the external memory 14 in normal and test modes, using either the PCI bus 34 or the SMB 40, are provided. As can be understood from this table, different external memory storage results are obtained, depending upon the particular data being written and the check bits.

With reference again to FIG. 2 in particular, the operation of the present invention will be described in the context of the test mode by which desired memory locations in one or more of the memory devices 50a . . . 50n are tested. In that regard, one write operation involving a single test pattern sequence is conducted and then a subsequent read operation is then conducted of the memory locations that were to store the test pattern sequence of this write operation. In one embodiment, the memory controller 18 addresses 64 data bits (plus check bits) per unique address. This set of 64 data bits can be referred to as one quad word (QWord) Commonly, all accesses to the external memory 14 are QWord accesses. The memory controller 18 is configured to operate in test mode by the application of the test mode control bit (test-chkbits of FIG. 2) to the write ECC/test check bit multiplexer 84.

Data for testing (test data and test check bits) is supplied to the memory controller 18 by a selected one of the bi-directional port 60 or the shared memory input port 68. From the selected one of the two ports 60, 68, the input data (e.g., 64 bits) is applied to the appropriate one of the two data source flip-flops 92, 96. The test data is outputted by whichever of the two flip-flops 92, 96 receives the data and transmits it to the test check bit multiplexer 88, which outputs additional bits including test check bits based on values or states of certain of the inputted data. In the disclosed embodiment, eight bits are output by the multiplexer 88.

The test data and test check bits are also input to the tri-state driver assembly 100. The test data and test check bits constitute one of the sources of data that is input to the driver assembly 100. Previous to receipt of the test data, the memory address of the QWord is provided by conventional logic of the memory controller 18 that is not shown in FIG. 2. Further logic circuitry is also included in the memory controller 18 to provide various other memory control signals. The test data and test check bits output by the driver assembly 100 are applied to the write data output flip-flop 112. Under control of the test mode control bit input to the multiplexer 84, typically at least some test check bits are output therefrom to the write ECC/test check bit output flip-flop 104, while other test check bits are output from the flip-flop 112. Simultaneously or essentially simultaneously, the test data and the test check bit data associated therewith are output from the memory controller 18 at ports 116, 108. The test data and test check bits are sent to the external memory 14 using the memory bus 44. Using the previously known or determined memory addresses, the test data and test check bits are stored in memory locations of one or more of the memory devices 50a . . . 50n. This completes the particular one write operation of the test mode.

Subsequently, a read operation is conducted of the same memory locations that were written to as part of the testing using the memory controller 18, which read operation may be conducted after writing one QWord or may be conducted after writing any number of QWords for testing purposes. Specifically, test data and test check bits are accessed from those memory locations that were written to during the particular single pattern sequence write operation. The test data and the test check bits are received at the memory data input port 124 using the memory bus 44 and at the memory ECC input port 128 using the memory bus 44. In the test mode of operation, the test data and test check bits are applied to the test mode data routing logic or circuit 132. The test data and test check bits are outputted therefrom in a desired sequential arrangement in combination with the subsequent determination as to whether or not there is any fault or error in one or more of the test check bits. In that regard, the test mode compare logic 150 compares values or states of certain test data with the values or states of the test check bits. In accordance with the example of FIG. 4, the values of the test data associated with bit locations 00–07 are compared with the test check bits that are provided to the test mode compare logic 150 using the bus or conductors that carry the test check bits from the test mode data routing logic 132. When an error in accuracy is determined by a lack of correspondence between the test check bits and those certain test data bits that should have corresponding values or states, an indication is outputted by the test mode compare logic 150. Additionally, information related to such an error is maintained or stored in one or more registers accessible through the PCI interface. Such information can include the address or addresses in the external memory 14 to which such check bits were written or stored during the write operation of the test mode so that information is obtainable as to the identity of the memory locations that stored the test check bits which failed the comparison.

In addition to the testing or checking of the test check bits, the test data itself is also tested by making comparisons, typically involving the test data and externally stored or computed data. In the illustrated embodiment, this comparison is conducted by logic separate from the memory controller 18. Upon completion of the comparisons and the attendant steps that are conducted when a lack of correspondence exists, the read operation of the test mode that is associated with the one test pattern sequence that was previously written is completed. Additional memory locations containing both test data and test check bits can be tested by appropriate mapping of test data and test check bits to these further memory locations so that the same steps are conducted and different ones of the memory devices 50a . . . 50n can be tested in the same manner.

The foregoing discussion of the invention has been presented for purposes of illustration and description. Further, the description is not intended to limit the invention to the form disclosed herein. Consequently, variation and modification commensurate with the above teachings, within the skill and knowledge of the relevant art, are within the scope of the present invention. The embodiments described hereinabove are further intended to explain the best mode presently known of practicing the invention and to enable others skilled in the art to utilize the invention as presented, or in other embodiments, and with the various modifications required by their particular application or uses of the invention. It is intended that the appended claims be construed to include alternative embodiments to the extent permitted by the prior art.

What is claimed is:

1. A method for testing a plurality of memory locations wherein memory means with some of the memory locations containing test data and other memory locations containing test check bits, comprising:

generating a first set of test data;

producing a first set of test check bits; and testing the memory locations of the memory means that store said first set of test data and said first set of test check bits using one write operation that includes writing both said first set of test data and said first set of test check bits to said memory locations.

2. A method, as claimed in claim 1, wherein:

said testing step includes using one read operation to read both said first set of test data and said first set of test check bits from said memory locations.

3. A method, as claimed in claim 1, wherein:

said testing step includes writing both said first set of test data and said first set of test check bits to said memory locations using said one write operation at substantially the same time.

4. A method, as claimed in claim 1, wherein:

said testing step includes reading both said first set of test data and said first set of test check bits and then determining whether said first set of test check bits read during said reading step correspond to said first set of test check bits that were written during said one write operation.

5. A method, as claimed in claim 4, wherein:

said determining step includes comparing said first set of test check bits with the test data stored in said some memory locations of said memory means that are different from said other memory locations of said memory means that store said first set of test check bits.

6. A method, as claimed in claim 1, wherein:

said testing step includes reading each of said first sets of test data and test check bits, determining whether said first set of test check bits that were read correspond to said first set of test check bits that were written, and ascertaining whether said first set of test data read correspond to said first set of test data that were written and wherein said determining and ascertaining steps are conducted separately.

7. A method, as claimed in claim 1, wherein:

said testing step includes reading said memory locations storing said first set of test data and said first set of test check bits.

8. An apparatus for testing memory locations containing test data and test check bits, comprising:

memory means having a plurality of memory locations for storing at least a first set of test data and a first set of test check bits;

memory bus means connected to said memory means; and a memory controller connected to said memory bus means and including:

a first system input port for receiving said first set of test data;

means for receiving a test control signal;

memory output port means communicating with said memory bus means for sending said first set of test data and said first set of test check bits to said memory means; and memory input port means communicating with said memory bus means for receiving said first set of test data and said first set of test check bits from said memory means;

wherein said first set of test data and said first set of test check bits are transferred during a single transfer operation of said memory bus means to test said memory locations containing said first set of test data and said first set of test check bits.

9. An apparatus, as claimed in claim 8, further including:

means for determining whether said first set of test check bits sent to said memory locations of said memory means using said memory output port means correspond to said first set of test check bits received by said memory input port means.

10. An apparatus, as claimed in claim 9, wherein:

said memory controller includes said means for determining.

11. An apparatus, as claimed in claim 9, wherein:

said means for determining uses at least some of said first set of test data received by said memory input port means.

12. An apparatus, as claimed in claim 8, further including:

means for ascertaining, different from said memory controller, whether said first set of test data received by said memory input port means correspond to said first set of test data transferred to said memory output port means.

13. An apparatus, as claimed in claim 8, wherein:

said memory controller further includes means for controlling whether said first set of test data or normal data is to be transferred to said memory means using said memory output port means.

14. An apparatus, as claimed in claim 8, wherein:

said memory controller includes error correction code circuitry that is utilized for normal data and not utilized for test data.

15. An apparatus, as claimed in claim 8, wherein:

said memory means includes a plurality of different memory devices, with each of said memory devices having a number of said memory locations and each of said memory devices being accessible using said memory controller.

16. An apparatus, as claimed in claim 8, wherein:

said memory means stores said first set of test data and said first set of test check bits at substantially the same time during said single transfer operation.

17. An apparatus, as claimed in claim 8, wherein:

said first sets of test data and test check bits are defined by a single test pattern sequence.

18. An apparatus, as claimed in claim 8, wherein:

said first sets of test data and test check bits include at least one memory word.

* * * * *